(12) United States Patent
Cha et al.

(10) Patent No.: US 8,847,414 B2
(45) Date of Patent: Sep. 30, 2014

(54) RESIN FOR TRANSPARENT ENCAPSULATION MATERIAL, AND ASSOCIATED ENCAPSULATION MATERIAL AND ELECTRONIC DEVICE

(75) Inventors: Sung-Hwan Cha, Uiwang-si (KR); Sang-Ran Koh, Uiwang-si (KR); Yong Kook Kim, Uiwang-si (KR); Woo-Han Kim, Uiwang-si (KR); Ha Neul Kim, Uiwang-si (KR); Chi Won An, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 73 days.

(21) Appl. No.: 13/339,510

(22) Filed: Dec. 29, 2011

(65) Prior Publication Data

US 2012/0168780 A1 Jul. 5, 2012

(30) Foreign Application Priority Data

Dec. 31, 2010 (KR) .................. 10-2010-0140560
Dec. 27, 2011 (KR) .................. 10-2011-0142972

(51) Int. Cl.
*H01L 23/29* (2006.01)
*C08L 83/05* (2006.01)

(52) U.S. Cl.
USPC ........... 257/791; 257/788; 438/106; 525/478; 528/15; 528/31; 528/32

(58) Field of Classification Search
None
See application file for complete search history.

(56) References Cited

U.S. PATENT DOCUMENTS

| | | | |
|---|---|---|---|
| 4,990,560 A * | 2/1991 | Ikeno et al. ................... 524/731 |
| 7,452,955 B2 * | 11/2008 | Tanaka et al. .................. 528/15 |
| 7,960,030 B2 * | 6/2011 | Itoh et al. ...................... 428/450 |
| 8,258,502 B2 | 9/2012 | Yoshitake et al. |
| 2003/0214051 A1 | 11/2003 | Dent et al. |
| 2006/0047097 A1 | 3/2006 | Tanaka et al. |
| 2006/0081864 A1 | 4/2006 | Nakazawa |
| 2007/0219312 A1 | 9/2007 | David |
| 2008/0318067 A1 | 12/2008 | Itoh et al. |
| 2009/0105395 A1 * | 4/2009 | Kamata et al. ................ 524/502 |

FOREIGN PATENT DOCUMENTS

| | | |
|---|---|---|
| CN | 101389695 A | 3/2009 |
| EP | 1-630-202 A2 | 3/2006 |
| EP | 1-845-133 A1 | 10/2007 |
| JP | 2010-018662 A * | 1/2010 |
| KR | 10 2005-0019076 A | 2/2005 |
| KR | 10 2006-0016107 A | 2/2006 |
| KR | 10 2007-0034962 A | 3/2007 |
| KR | 10 2008-0110761 A | 12/2008 |
| KR | 10 2009-0086425 A | 8/2009 |
| WO | WO-2004/107458 A2 | 12/2004 |
| WO | WO 2005/111149 A1 * | 11/2005 |
| WO | WO-2007/100445 A2 | 9/2007 |

OTHER PUBLICATIONS

Machine-generated translation of JP 2010-018662 into English.*
Taiwanese Search Report dated Dec. 4, 2013.

* cited by examiner

*Primary Examiner* — Marc Zimmer
(74) *Attorney, Agent, or Firm* — Lee & Morse, P.C.

(57) ABSTRACT

A resin for an encapsulation material includes a first polysiloxane including hydrogen bound to silicon (Si—H) at its terminal end, and a second polysiloxane including an alkenyl group bound to silicon (Si—Vi) at its terminal end, wherein a ratio (Si—H/Si—Vi) of hydrogen bound to silicon (Si—H) in the first polysiloxane to the alkenyl group bound to silicon (Si—Vi) in the second polysiloxane is about 1 to about 1.

17 Claims, No Drawings

RESIN FOR TRANSPARENT ENCAPSULATION MATERIAL, AND ASSOCIATED ENCAPSULATION MATERIAL AND ELECTRONIC DEVICE

BACKGROUND

1. Field

Embodiments relate to a resin for a transparent encapsulation material, and an associated encapsulation material and electronic device.

2. Description of the Related Art

A light emitting element, such as a light emitting diode (LED), an organic light emitting device (OLED), a photoluminescent (PL) device, and the like, may be variously applied to a domestic electric device, a lighting device, a display device, various automatic devices, and the like. In some cases, the light emitting element may display intrinsic colors of a light emitting material such as blue, red, and green using a light emitter, or white by combining light emitters displaying different colors. In other cases, an electronic device may receive light.

SUMMARY

An embodiment is directed to a resin for an encapsulation material, the resin including a first polysiloxane including hydrogen bound to silicon (Si—H) at its terminal end, and a second polysiloxane including an alkenyl group bound to silicon (Si—Vi) at its terminal end. A ratio (Si—H/Si—Vi) of hydrogen bound to silicon (Si—H) in the first polysiloxane to the alkenyl group bound to silicon (Si—Vi) in the second polysiloxane may be about 1 to about 1.2.

The ratio (Si—H/Si—Vi) may be about 1.05 to about 1.15.

The first polysiloxane may be represented by the following Chemical Formula 1:

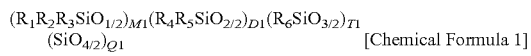
[Chemical Formula 1]

In Chemical Formula 1, $R_1$ to $R_6$ may each independently be hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, provided that at least one of $R_1$ to $R_6$ is hydrogen, and the Formula may satisfy $0<M1<1$, $0<D1<1$, $0≤T1<1$, $0≤Q1<1$, and $M1+D1+T1+Q1=1$.

The second polysiloxane may be represented by the following Chemical Formula 2:

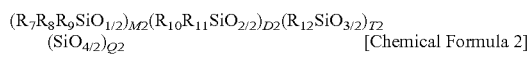
[Chemical Formula 2]

In Chemical Formula 2, $R_7$ to $R_{12}$ may each independently be a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, provided that at least one of $R_7$ to $R_{12}$ includes the substituted or unsubstituted C2 to C30 alkenyl group, and the Formula may satisfy $0<M2<1$, $0<D2<1$, $0<T2<1$, $0≤Q2<1$, and $M2+D2+T2+Q2=1$.

The first polysiloxane may be represented by the following Chemical Formula 1:

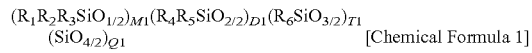
[Chemical Formula 1]

In Chemical Formula 1, $R_1$ to $R_6$ may each independently be hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, provided that at least one of $R_1$ to $R_6$ is hydrogen, and the Formula may satisfy $0<M1<1$, $0<D1<1$, $0≤T1<1$, $0≤Q1<1$, and $M1+D1+T1+Q1=1$.

The first polysiloxane may be included in an amount of less than about 50 wt % based on the total amount of the resin, and the second polysiloxane may be included in an amount of more than about 50 wt % based on the total amount of the resin.

The second polysiloxane may be included in an amount of about 65 wt % to about 99 wt % based on the total amount of resin.

The first polysiloxane may have a weight average molecular weight of about 100 g/mol to about 10,000 g/mol.

The first polysiloxane may have a weight average molecular weight of about 100 g/mol to about 3,000 g/mol.

The second polysiloxane may have a weight average molecular weight of about 1,000 g/mol to about 100,000 g/mol.

The second polysiloxane may have a weight average molecular weight of about 1,000 g/mol to 20,000 g/mol.

The resin may further include a hydrosilation catalyst.

Another embodiment is directed to a transparent encapsulation material prepared by curing the resin according to an embodiment.

The encapsulation material may exhibit a light transmittance (T) of about 80% to about 100%.

The encapsulation material may exhibit a light transmittance decrease ratio (ΔT) of less than about 15% after heating at about 120° C. for about 500 hours.

The encapsulation material may exhibit a light transmittance decrease ratio (ΔT) of less than about 15% after heating at about 180° C. for about 150 hours.

The encapsulation material may exhibit a tackiness of less than about 100 kgf.

Another embodiment is directed to an electronic device including a transparent encapsulation material according to an embodiment.

The electronic device may include one or more of a light emitting diode, an organic light emitting device, a photo luminescent device, and a solar cell.

Another embodiment is directed to a method of manufacturing an electronic device, including providing an element that receives and/or emits light, the element including one or more of a light emitting diode, an organic light emitting device, a photo luminescent device, and a solar cell, at least partially covering the element with a resin, and curing the resin to form a transparent material, wherein the resin is a resin according to an embodiment.

DETAILED DESCRIPTION

Korean Patent Applications No. 10-2010-0140560 and 10-2011-0142972, filed on Dec. 31, 2010 and Dec. 27, 2011, respectively, in the Korean Intellectual Property Office, and entitled: "Transparent Resin for Encapsulation material And Encapsulation Material And Electronic Device Including The Same," are incorporated by reference herein in their entireties.

Example embodiments will now be described more fully hereinafter; however, they may be embodied in different forms and should not be construed as limited to the embodiments set forth herein. Rather, these embodiments are provided so that this disclosure will be thorough and complete, and will fully convey the scope of the invention to those skilled in the art.

As used herein, when a definition is not otherwise provided, the term "substituted" may refer to one substituted with at least a substituent selected from the group of a halogen (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C30 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof, instead of hydrogen of a compound.

As used herein, when a definition is not otherwise provided, the prefix "hetero" may refer to one including 1 to 3 heteroatoms selected from N, O, S, and P.

Hereinafter, a resin for a transparent encapsulation material according to an example embodiment is described.

The resin for a transparent encapsulation material according to an example embodiment includes a first polysiloxane including hydrogen bound to silicon (Si—H) at its terminal end, and includes a second polysiloxane including an alkenyl group bound to silicon (Si—Vi) at its terminal end.

The first polysiloxane may be represented by the following Chemical Formula 1.

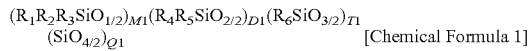
[Chemical Formula 1]

In Chemical Formula 1, $R_1$ to $R_6$ may each independently be hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, where at least one of $R_1$ to $R_6$ may be hydrogen. Chemical Formula 1 may satisfy the relations $0<M1<1$, $0<D1<1$, $0\leq T1<1$, $0\leq Q1<1$, and $M1+D1+T1+Q1=1$, where M1, D1, T1, and Q1 denote each mole ratio.

The second polysiloxane may be represented by the following Chemical Formula 2.

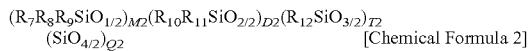
[Chemical Formula 2]

In Chemical Formula 2, $R_7$ to $R_{12}$ may each independently be a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, where at least one of $R_7$ to $R_{12}$ may be a substituted or unsubstituted C2 to C30 alkenyl group. Chemical Formula 2 may satisfy the relations $0<M2<1$, $0<D2<1$, $0<T2<1$, $0\leq Q2<1$, and $M2+D2+T2+Q2=1$, where M2, D2, T2, and Q2 denote each mole ratio.

A cross-linking bond and curing degree of the resin may be controlled by including both the first polysiloxane (including hydrogen bound to silicon (Si—H) at its terminal end) and the second polysiloxane (having an alkenyl group bound to silicon (Si—Vi) at its terminal end). The resin may have a ratio (Si—H/Si—Vi) of the hydrogen bound to silicon (Si—H) to the alkenyl group bound to silicon (Si—Vi) of about 1 to 1.2. The ratio (Si—H/Si—Vi) (representing the ratio of the hydrogen bound to silicon (Si—H) to the alkenyl group bound to silicon (Si—Vi)) may be about 1.05 to 1.15, for example, about 1.10.

Including the hydrogen bound to silicon (Si—H) and the alkenyl group bound to silicon (Si—Vi) at a ratio (Si—H/Si—Vi) within the range may improve the heat resistance and tackiness, as well as maintain the light transmittance of the cured resin.

In an example embodiment, the resin having the ratio (Si—H/Si—Vi) of hydrogen bound to silicon (Si—H) to the alkenyl group bound to silicon (Si—Vi) within the range may have a light transmittance of about 80% to about 100% with reference to a wavelength of about 450 nm after curing, and may have a light transmittance decrease ratio (ΔT) (described below) of less than about 15% even when exposed at a high temperature for a long time. Thus, the resin may ensure the heat resistance, so it may prevent a significant deterioration of light transmittance due to yellowing, even when exposed to a high temperature for a long time.

In addition, the resin having the ratio (Si—H/Si—Vi) of hydrogen bound to silicon (Si—H) to the alkenyl group bound to silicon (Si—Vi) within the range may have a tackiness of less than about 100 kgf after curing. The tackiness refers to the tacking degree on the surface of cured resin. When the tackiness is strong, it may cause process difficulties if adjacent encapsulation materials are tacked to each other during preparing the encapsulation material provided by curing the resin.

In the resin including alkenyl group bound to silicon (Si—Vi) at its terminal end and a first polysiloxane including hydrogen bound to silicon (Si—H) at its terminal end according to an embodiment, the heat resistance and tackiness may be significantly improved by controlling the ratio (Si—H/Si—Vi) of hydrogen bound to silicon (Si—H) and the alkenyl group bound to silicon (Si—Vi) within the range.

The first polysiloxane may have a weight average molecular weight of about 100 g/mol to about 10,000 g/mol, for example about 100 g/mol to about 3,000 g/mol.

The first polysiloxane may be included in an amount of less than about 50 wt %, for example, about 1 to about 35 wt %, based on the total amount of resin.

The second polysiloxane have a weight average molecular weight of about 1,000 g/mol to about 100,000 g/mol, and specifically about 1,000 g/mol to about 20,000 g/mol.

The second polysiloxane may be included in an amount of more than about 50 wt %, for example, about 65 wt % to about 99 wt %, based on the total amount of resin.

With the first polysiloxane and the second polysiloxane within the range of the weight average molecular weight and the amounts, respectively, the reactivity of the resin may be controlled.

The resin may further include a hydrosilation catalyst. The hydrosilation catalyst may accelerate the hydrosilation reaction between hydrogen bound to silicon (Si—H) parts of the first polysiloxane and the alkenyl group bound to silicon (Si—Vi) parts of the second polysiloxane, and it may include, for example, one or more of platinum, rhodium, palladium, ruthenium, iridium, etc. The hydrosilation catalyst may be used to promote a hydrosilation reaction between the Si—H moiety of the first polysiloxane and the unsaturated bond of the alkenyl of the Si—Vi moiety of the second polysiloxane.

The hydrosilation catalyst may be included in an amount of about 0.1 ppm to about 1,000 ppm based on the total amount of the resin.

The resin may further include a catalyst inhibitor. The catalyst inhibitor may be included in an amount of about 0.001 wt % to about 1 wt %, based on the total amount of resin.

The resin may further include an adhesion promoter. The adhesion promoter may include, for example, one or more of glycidoxypropyltrimethoxysilane, vinyltriethoxysilane, glycidoxypropyltriethoxysilane, etc.

The resin may be cured to be used as a transparent encapsulation material of an electronic device. For example, the curing may be performed by coating the resin on a substrate with a thickness of about 0.01 mm to 3 mm, and then heat-treating the coated resin at a temperature of about 100 to 300° C. for about 1 to 10 hours. The electronic device may include, for example, one or more of a light emitting diode, an organic light emitting device, a photo luminescent device, a solar cell, etc.

The encapsulation material made with the resin according to an embodiment may resist a yellowing phenomenon or deterioration, e.g., when exposed at a high temperature for a long time. The encapsulation material made with the resin according to an embodiment may exhibit a high light transmittance, which may help the heat resistance. The encapsulation material made with the resin according to an embodiment may improve processibility due to a low tackiness.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

Synthesis of First Polysiloxane

Water and toluene were mixed in a weight ratio 5:5 to prepare a mixed solvent. 1 kg of the mixed solvent was put into a 3-necked flask, and diphenyl dichlorosilane and tetramethyldisiloxane with a mole ratio of 40:60 were added dropwise thereto, while the flask was maintained at 23° C. When the dropwise addition was complete, the mixture was heated and refluxed to perform a condensation polymerization reaction at 50° C. for 3 hours. The resulting reactant was cooled down to room temperature, and a water layer therein was removed, preparing a solution in which a polymer was dissolved in toluene. The polymer solution was cleaned with water to remove chlorine, a reaction byproduct. Then, the neutralized polymer solution was distilled under reduced pressure to remove toluene, preparing liquid polysiloxane.

The polysiloxane was measured regarding weight average molecular weight through gel permeation chromatography and the molecular weight reduced to polystyrene was determined to be 750 g/mol. The polysiloxane was identified to have a structure of Chemical Formula A using H-NMR, Si—NMR, and element analyzer. Herein, "Me" indicates a methyl group, "Ph" indicates a phenyl group, "Si" indicates silicon, and "H" indicates hydrogen.

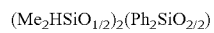 [Chemical Formula A]

Synthesis of Second Polysiloxane 1 kg of a mixed solvent prepared by mixing water and toluene at a weight ratio of 5:5 was put into a 3-neck flask and then, allowed to stand at 23° C. Subsequently, phenyltrichlorosilane, phenylmethyldichlorosilane, and vinyldimethylchlorosilane were mixed with a mole ratio 27:55:18. The mixture was heated and refluxed to perform a condensation polymerization reaction at 90° C. for 3 hours. The resulting reactant was cooled down to room temperature, and a water layer therein was removed, preparing a solution in which a polymer was dissolved in toluene. The polymer solution was cleaned with water to remove chlorine, a reaction byproduct. Subsequently, the neutralized polymer solution was distilled under a reduced pressure to remove toluene and obtain liquid polysiloxane.

The obtained polysiloxane was measured regarding weight average molecular weight through a gel permeation chromatography, and was determined to have a molecular weight reduced to polystyrene of 2,500 g/mol. The polysiloxane was determined to have a structure represented by Chemical Formula B using H-NMR, Si—NMR, and an element analyzer. Herein, "Me" indicates a methyl group; "Ph" indicates a phenyl group; "Vi" indicates a vinyl group; and "Si" indicates silicon.

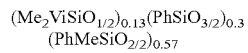 [Chemical Formula B]

Preparation of Resin

Example 1

13.6 wt % of the first polysiloxane represented by the Chemical Formula A and 86.4 wt % of the second polysiloxane represented by the Chemical Formula B were mixed and added with PS-CS-2.0CS (manufactured by Unicore) as hydrosilation catalyst to provide a Pt amount of 2 ppm. Further, 0.002 wt % of Surfynol (manufactured by TCI) as a catalyst inhibitor was added thereto. The silicon-hydrogen bond (Si—H) and the silicon-alkenyl group bond (Si—Vi) were present at a ratio (Si—H/Si—Vi) of about 1.00.

The mixed solution was coated on a substrate in a thickness of 1 mm, and heated at 150° C. for 2 hours and cured to provide a cured specimen.

Example 2

14.2 wt % of the first polysiloxane represented by the Chemical Formula A and 85.8 wt % of the second polysiloxane represented by the Chemical Formula B were mixed and added with PS-CS-2.0CS (manufactured by Unicore) to provide a Pt amount of 2 ppm. Further, 0.002 wt % of Surfynol (manufactured by TCI) as a catalyst inhibitor was added thereto. The silicon-hydrogen bond (Si—H) and the silicon-alkenyl group bond (Si—Vi) were present at a ratio (Si—H/Si—Vi) of about 1.05.

The mixed solution was coated on a substrate in a thickness of 1 mm, and heated at 150° C. for 2 hours and cured to provide a cured specimen.

Example 3

14.8 wt % of the first polysiloxane represented by the Chemical Formula A and 85.2 wt % of the first polysiloxane represented by the Chemical Formula B were mixed and added with PS-CS-2.0CS (manufactured by Unicore) to provide a Pt amount of 2 ppm. Further, 0.002 wt % of Surfynol (manufactured by TCI) as a catalyst inhibitor was added thereto. The silicon-hydrogen bond (Si—H) and the silicon-alkenyl group bond (Si—Vi) were present at a ratio (Si—H/Si—Vi) of about 1.10.

The mixed solution was coated on a substrate in a thickness of 1 mm, and heated at 150° C. for 2 hours and cured to provide a cured specimen.

Example 4

15.3 wt % of the first polysiloxane represented by the Chemical Formula A and 84.7 wt % of the second polysiloxane represented by the Chemical Formula B were mixed and added with PS-CS-2.0CS (manufactured by Unicore) to provide a Pt amount of 2 ppm. Further, 0.002 wt % of Surfynol (manufactured by TCI) as a catalyst inhibitor was added thereto. The silicon-hydrogen bond (Si—H) and the silicon-alkenyl group bond (Si—Vi) were present at a ratio (Si—H/Si—Vi) of about 1.15.

The mixed solution was coated on a substrate in a thickness of 1 mm, and heated and cured at 150° C. for 2 hours to provide a cured specimen.

Example 5

15.9 wt % of the first polysiloxane represented by the Chemical Formula A and 84.1 wt % of the second polysiloxane represented by the Chemical Formula B were mixed and added with PS-CS-2.0CS (manufactured by Unicore) to provide a Pt amount of 2 ppm. Further, 0.002 wt % of Surfynol (manufactured by TCI) as a catalyst inhibitor was added thereto. The silicon-hydrogen bond (Si—H) and the silicon-alkenyl group bond (Si—Vi) were present at a ratio (Si—H/Si—Vi) of about 1.20.

The mixed solution was coated on a substrate in a thickness of 1 mm, and heated and cured at 150° C. for 2 hours to provide a cured specimen.

Comparative Example 1

11.2 wt % of the first polysiloxane represented by the Chemical Formula A and 88.8 wt % of the second polysiloxane represented by the Chemical Formula B were mixed and added with PS-CS-2.0CS (manufactured by Unicore) to provide a Pt amount of 2 ppm. Further, 0.002 wt % of Surfynol (manufactured by TCI) as a catalyst inhibitor was added thereto. The silicon-hydrogen bond (Si—H) and the silicon-alkenyl group bond (Si—Vi) were present at a ratio (Si—H/Si—Vi) of about 0.8.

The mixed solution was coated on a substrate in a thickness of 1 mm, and heated and cured at 150° C. for 2 hours to provide a cured specimen.

Comparative Example 2

19.1 wt % of the first polysiloxane represented by the Chemical Formula A and 80.9 wt % of the second polysiloxane represented by the Chemical Formula were mixed and added with PS-CS-2.0CS (manufactured by Unicore) to provide a Pt amount of 2 ppm. Further, 0.002 wt % of Surfynol (manufactured by TCI) as a catalyst inhibitor was added thereto. The silicon-hydrogen bond (Si—H) and the silicon-alkenyl group bond (Si—Vi) were present at a ratio (Si—H/Si—Vi) of about 15.00.

The mixed solution was coated on a substrate in a thickness of 1 mm, and heated and cured at 150° C. for 2 hours to provide a cured specimen.

Evaluation—1

Each cured resin obtained from Examples 1 to 5 and Comparative Example 1 and 2 was measured for initial light transmittance and heat resistance.

The initial light transmittance was determined by measuring the cured resin at a wavelength of 450 nm using a UV-spectrophotometer (Shimadzu, UV-3600).

The heat resistance was determined by heating the cured resin at 120° C. for 1,000 hours and measuring light transmittance according to the same method.

The results are described with reference to Table 1.

TABLE 1

|  | Ex. 1 | Ex. 2 | Ex. 3 | Ex. 4 | Ex. 5 | Comp. Ex. 1 | Comp. Ex. 2 |
|---|---|---|---|---|---|---|---|
| Initial light transmittance (%) | 97.0 | 96.9 | 97.3 | 97.2 | 97.5 | 97.2 | 97.1 |
| Light transmission after heating (%) | 88.3 | 92.2 | 96.0 | 91.1 | 85.3 | 75.5 | 76.6 |
| Light transmission decrease ratio (%) | 8.7 | 4.7 | 1.3 | 6.1 | 12.2 | 21.7 | 20.5 |

Referring to Table 1, the cured resins of Examples 1 to 5 according to example embodiments had a transmittance difference between the initial transmittance and the transmittance after heating at 120° C. for 500 hours (i.e., a light transmission decrease ratio ΔT) within about 15%. In addition, the cured resins of Examples 2, 3, and 4 according to example embodiments had excellent transmission decrease ratios, which were about 7% or less. In addition, the cured resin of Example 3 according to an example embodiment had the best transmission decrease ratio, which was about 1.3%.

On the other hand, the cured resin according to Comparative Example 1 and 2 had a light transmittance decrease ratio of about 20% or more after heating at 120° C. for 500 hours.

From the results, it is confirmed that the resins of Examples 1 to 5 provided improved heat resistance.

Evaluation—2

The cured resins according to Examples 1 to 5 and Comparative Example 1 and 2 were measured for the heat resistance again under a higher temperature condition.

The initial light transmittance was measured in accordance with the same procedure as in above.

The heat resistance was determined by measuring the light transmittance according to the same method after heating the cured resin at 180° C. for 150 hours.

The results are described with reference to Table 2.

TABLE 2

|  | Ex. 1 | Ex. 2 | Ex. 3 | Ex. 4 | Ex. 5 | Comp. Ex. 1 | Comp. Ex. 2 |
|---|---|---|---|---|---|---|---|
| Initial light transmittance (%) | 97.0 | 96.9 | 97.3 | 97.2 | 97.5 | 97.2 | 97.1 |
| Light transmittance (%) | 85.6 | 91.0 | 95.4 | 90.2 | 83.9 | 73.5 | 74.1 |
| Light transmittance decrease ratio (%) | 11.4 | 5.9 | 1.9 | 7.0 | 13.6 | 23.7 | 23.0 |

Referring to Table 2, the cured resins of Examples 1 to 5 according to example embodiments had a transmittance difference (between the initial transmittance and the transmittance after heating at 180° C. for 150 hours) within about 15%. In addition, the cured resins of Examples 2, 3, and 4 according to example embodiments had better transmittance decrease ratios, which were about 7% or less. In addition, the cured resin of Example 3 according to an example embodiment had the best transmission decrease ratio, which was of about 1.9%.

On the other hand, the cured resin according to Comparative Example 1 and 2 had a light transmittance decrease ratio of about 23% after heating at 180° C. for 150 hours.

From the results, it is confirmed that the resins of Examples 1 to 5 provided improved heat resistance.

Evaluation—3

The cured resins according to Examples 1 to 5 and Comparative Example 1 and 2 were measured for tackiness.

The tackiness was determined by applying a constant load to the cured resin using TopTac 2000A, and measuring the force during detaching the same.

The details are the below:
Device: TopTac 2000A
Test Zig: 1 inch Half Ball, SS, Compressive Load 300.00 gf
Test Velocity: Target Displacement 10.00 mm
  prop 0.08 mm/sec
  Dwell 300 gf, 10 sec
  Rise 0.1 mm/sec
The results are described with reference to Table 3.

TABLE 3

|  | Ex. 1 | Ex. 2 | Ex. 3 | Ex. 4 | Ex. 5 | Comp. Ex. 1 | Comp. Ex. 2 |
|---|---|---|---|---|---|---|---|
| Tackiness (kgf) | 93 | 33 | 21 | 25 | 86 | 180 | 120 |

Referring to Table 3, the cured resins of Examples 1 to 5 according to example embodiments had a tackiness of about 100 kgf or less, which is satisfactory. In addition, the resins of Example 2, 3, and 4 according to example embodiments provided remarkably low tackiness, and the resin according to Example 3 provided the lowest tackiness of about 21 kgf.

On the other hand, the resin according to Comparative Example 1 and 2 provided the highest tackiness.

From the results, it is confirmed that the resins according to Examples 1 to 5 provided significantly improved tackiness.

From the results, it can be understood that the heat resistance and tackiness were significantly improved by using a resin according to example embodiments, the resin having the ratio (Si—H/Si—Vi) of silicon-hydrogen bond (Si—H) to silicon-alkenyl group bond (Si—Vi) of the first polysiloxane and the second polysiloxane within the stated range.

By way of summation and review, a light emitting element may generally have a packaging or encapsulation structure. The packaging or encapsulation structure may be made of a transparent encapsulation material being able to externally pass light emitted from a light emitter. Similarly, an electronic device such as a solar cell may be packaged or encapsulated with a transparent encapsulation material that is able to pass light, e.g., sun light. The encapsulant may be positioned in a place where light is passed, and thus characteristics such as transmittance and heat resistance of the encapsulant may affect the light efficiency of the device. In addition, the transparent encapsulant may be provided in a structure covering a light emitter, so as to be disposed on the surface of light emitting element, wherein it may be exposed.

An embodiment may provide a resin for a transparent encapsulation material that enhances the processibility as well as prevents the deterioration of light efficiency by improving the physical property of resin. Another embodiment may provide an encapsulation material including the resin. Another embodiment may provide an electronic device including the encapsulation material. In the encapsulation material, heat resistance and tackiness may be significantly improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A resin for an encapsulation material, the resin comprising:
a first polysiloxane including hydrogen bound to silicon (Si—H) at its terminal end,
a second polysiloxane including an alkenyl group bound to silicon (Si—Vi) at its terminal end, and
an adhesion promoter,
wherein:
a ratio (Si—H/Si—Vi) of hydrogen bound to silicon (Si—H) in the first polysiloxane to the alkenyl group bound to silicon (Si—Vi) in the second polysiloxane is about 1 to about 1.2; the resin being curable to form an encapsulation material that exhibits a light transmittance (T) of about 80% to about 100%, and
the second polysiloxane is represented by the following Chemical Formula 2:

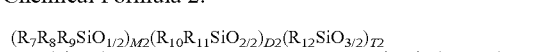

$(R_7R_8R_9SiO_{1/2})_{M2}(R_{10}R_{11}SiO_{2/2})_{D2}(R_{12}SiO_{3/2})_{T2}$
$(SiO_{4/2})_{Q2}$     [Chemical Formula 2]

wherein, in Chemical Formula 2,
$R_7$ to $R_{12}$ are each independently a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, provided that at least one of $R_7$ to $R_{12}$ includes the substituted or unsubstituted C2 to C30 alkenyl group, $0<M2<1, 0<D2<1, 0<T2<1, 0\leq Q2<1,$ and $M2+D2+T2+Q2=1.$ 2. The resin as claimed in claim 1, wherein the ratio (Si—H/Si—Vi) is about 1.05 to about 1.15.

3. The resin as claimed in claim 1, wherein the first polysiloxane is represented by the following Chemical Formula 1:

$(R_1R_2R_3SiO_{1/2})_{M1}(R_4R_5SiO_{2/2})_{D1}(R_6SiO_{3/2})_{T1}(SiO_{4/2})_{Q1}$ [Chemical Formula 1]

wherein, in Chemical Formula 1, $R_1$ to $R_6$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, provided that at least one of $R_1$ to $R_6$ is hydrogen, $0<M1<1, 0<D1<1, 0\leq T1<1, 0\leq Q1<1,$ and $M1+D1+T1+Q1=1.$ 4. The resin as claimed in claim 1, wherein:
the first polysiloxane is included in an amount of less than about 50 wt % based on the total amount of the resin, and
the second polysiloxane is included in an amount of more than about 50 wt % based on the total amount of the resin.

5. The resin as claimed in claim 4, wherein the second polysiloxane is included in an amount of about 65 wt % to about 99 wt % based on the total amount of resin.

6. The resin as claimed in claim 1, wherein the first polysiloxane has a weight average molecular weight of about 100 g/mol to about 10,000 g/mol.

7. The resin as claimed in claim 6, wherein the first polysiloxane has a weight average molecular weight of about 100 g/mol to about 3,000 g/mol.

8. The resin as claimed in claim 1, wherein the second polysiloxane has a weight average molecular weight of about 1,000 g/mol to about 100,000 g/mol.

9. The resin as claimed in claim 8, wherein the second polysiloxane has a weight average molecular weight of about 1,000 g/mol to 20,000 g/mol.

10. The resin as claimed in claim 1, further comprising a hydrosilation catalyst.

11. A transparent encapsulation material prepared by curing the resin of claim 1.

12. The encapsulation material as claimed in claim 11, wherein the encapsulation material exhibits a light transmittance decrease ratio ($\Delta T$) of less than about 15% after heating at about 120° C. for about 500 hours.

13. The encapsulation material as claimed in claim 11, wherein the encapsulation material exhibits a light transmittance decrease ratio ($\Delta T$) of less than about 15% after heating at about 180° C. for about 150 hours.

14. The encapsulation material as claimed in claim 11, wherein the encapsulation material exhibits a tackiness of less than about 100 kgf.

15. An electronic device comprising the transparent encapsulation material of claim 11.

16. The electronic device as claimed in claim 15, wherein the electronic device includes one or more of a light emitting diode, an organic light emitting device, a photo luminescent device, and a solar cell.

17. A method of manufacturing an electronic device, the method comprising:
providing an element that receives and/or emits light, the element including one or more of a light emitting diode, an organic light emitting device, a photo luminescent device, and a solar cell;
at least partially covering the element with a resin; and
curing the resin to form a transparent material;
wherein the resin includes:
a first polysiloxane including hydrogen bound to silicon (Si—H) at its terminal end,
a second polysiloxane including an alkenyl group bound to silicon (Si—Vi) at its terminal end, and
an adhesion promoter,
wherein a ratio (Si—H/Si—Vi) of hydrogen bound to silicon (Si—H) in the first polysiloxane to the alkenyl group bound to silicon (Si—Vi) in the second polysiloxane is about 1 to about 1.2; the resin being curable to form an encapsulation material that exhibits a light transmittance (T) of about 80% to about 100%.

* * * * *